(12) United States Patent
Hsiao et al.

(10) Patent No.: US 8,013,351 B2
(45) Date of Patent: Sep. 6, 2011

(54) LEAK-PROOF LED BASE STRUCTURE

(75) Inventors: Sheng Yan Hsiao, Taipei (TW); Hsiao Wen Wei, Taipei (TW); Chung Ching Lin, Taipei (TW)

(73) Assignee: TCST Tech Co., Ltd., Taipei (TW)

( * ) Notice: Subject to any disclaimer, the term of this patent is extended or adjusted under 35 U.S.C. 154(b) by 373 days.

(21) Appl. No.: 12/431,861

(22) Filed: Apr. 29, 2009

(65) Prior Publication Data

US 2010/0182792 A1      Jul. 22, 2010

(30) Foreign Application Priority Data

Jan. 22, 2009   (TW) ............................... 98201345 U (51) Int. Cl.
*H01L 33/00* (2010.01)
(52) U.S. Cl. .............................. 257/98; 257/99; 257/100
(58) Field of Classification Search ............. 257/98–100
See application file for complete search history.

(56) References Cited

U.S. PATENT DOCUMENTS

| | | | |
|---|---|---|---|
| 6,770,498 B2 * | 8/2004 | Hsu ................................ 438/26 |
| 6,921,926 B2 * | 7/2005 | Hsu ................................ 257/98 |
| 2007/0262335 A1 * | 11/2007 | Kumei et al. ................... 257/98 |

FOREIGN PATENT DOCUMENTS

| | | | |
|---|---|---|---|
| JP | 2007194518 | * | 8/2007 |
| JP | 2007194519 | * | 8/2007 |
| JP | 2007194520 | * | 8/2007 |
| JP | 2007214471 | * | 8/2007 |
| TW | M337845 | | 12/1996 |

* cited by examiner

*Primary Examiner* — Zandra Smith
*Assistant Examiner* — Telly Green
(74) *Attorney, Agent, or Firm* — Stites & Harbison PLLC; Juan Carlos A. Marquez, Esq.

(57) ABSTRACT

A leak-proof LED (Light Emitting Diode) base structure includes a ceramic substrate and a ceramic reflection ring. The ceramic reflection ring is coupled to the ceramic substrate by a heat-resistant epoxy resin to prevent encapsulant filled in an LED base from flowing out through a junction between the ceramic reflection ring and the ceramic substrate. A groove for receiving an overflow of the heat-resistant epoxy resin is formed on a coupling surface of the ceramic reflection ring. The ceramic reflection ring has a polished reflecting surface for reflecting light emitted by an LED die so as to increase luminosity of the light emitted by the LED. A lens positioning portion is formed on the top of the polished reflecting surface for allowing a lens to be precisely aligned with the ceramic reflection ring, enhancing preciseness of lens assembly, and improving resultant optical configuration of the light emitted by the LED.

20 Claims, 7 Drawing Sheets

LEAK-PROOF LED BASE STRUCTURE

BACKGROUND OF THE INVENTION

1. Technical Field

The present invention relates to leak-proof LED (Light Emitting Diode) base structures, and more particularly, to a leak-proof LED base structure for use with LEDs (Light Emitting Diodes).

2. Description of Related Art

Taiwan Patent No. M337845 discloses an LED reflection ring and a substrate coupled to each other by a coupling agent made of heat-resistant silicon oxide, such as high-temperature glass cement. The coupling agent is resistant to the high operating temperature of a high-power LED and thus serves to couple the LED reflection ring and the substrate together firmly despite the high temperature.

However, it is difficult to precisely control the amount of the high-temperature glass cement used in coupling the reflection ring and the substrate together. Hence, overuse of the high-temperature glass cement between the reflection ring and the substrate usually results in an overflow of the high-temperature glass cement. Consequently, light emitted by an LED die likely leaks out of the origin of the overflow of the high-temperature glass cement. Accordingly, the LED die is flawed with reduced front emission of light.

Also, over and unevenly applied high-temperature glass cement causes encapsulant filled in an LED base to flow out through the junction of the reflection ring and the substrate. Besides, moisture tends to enter the LED base via the junction. As a result, the service life and light-emission efficiency of the LED are compromised greatly.

Furthermore, in an attempt to increase luminosity of light emitted by the LED, a metal reflection layer is coated to a reflecting surface of the reflection ring so as to reflect light emitted by the LED die and increase the light emitted by the LED die. However, owing to porosity and coarseness of materials of which the reflection ring is made, the metal reflection layer on the reflecting surface of the reflection ring is lackluster and ineffective in reflection, thereby resulting in massive absorption and diffusion of light and deteriorated reflectivity. Eventually, the attempt is made to no avail.

Besides, in an attempt to enhance light-emission efficiency of the LED, a lens is provided on the reflection ring. However, the optical axis of the lens is unlikely to be precisely aligned with the optical axis of light emission of the LED die during a lens assembly process, and thus the resultant optical configuration of the LED is very different from the design thereof. Therefore, LED base manufacturers are confronted with an issue, that is, developing an LED base structure that enables improvement in preciseness of lens assembly and streamlining of the lens assembly process.

SUMMARY OF THE INVENTION

The present invention provides a leak-proof LED base structure, wherein a ceramic substrate and a ceramic reflection ring are coupled to each other by a heat-resistant epoxy resin, so as to enable an LED base to sustain extremely high temperature during its manufacturing process.

The present invention provides the leak-proof LED base structure, wherein the ceramic substrate and the ceramic reflection ring are firmly coupled to each other by the heat-resistant epoxy resin, so as to prevent light emitted by an LED die from leaking through the junction of the ceramic substrate and the ceramic reflection ring.

The present invention provides the leak-proof LED base structure, wherein a groove for receiving an overflow of the heat-resistant epoxy resin is formed on a coupling surface of the ceramic reflection ring, so as to prevent the heat-resistant epoxy resin from flowing out of the ceramic reflection ring.

The present invention provides the leak-proof LED base structure, wherein a reflecting surface of the ceramic reflection ring is polished to form a polished reflecting surface, so as to increase luminosity of light emitted by the LED.

The present invention provides the leak-proof LED base structure, wherein the ceramic reflection ring is equipped with a lens positioning portion so as to save time for a lens assembly process and enhance preciseness in positioning a lens.

To achieve the above and other effects, the present invention provides a leak-proof LED base structure, comprising: a ceramic substrate having a first surface and a second surface, the first surface being provided with at least a pair of first electrodes thereon, formed with a die-mounting metal layer thereon, and defined with a coupling area, and the second surface being provided with a pair of second electrodes electrically connected to the first electrodes, respectively; and a ceramic reflection ring having a coupling surface, a polished reflecting surface, and a lens positioning portion formed at a top of the polished reflecting surface, wherein the coupling surface is adjacent to the polished reflecting surface, coupled to the coupling area by a heat-resistant epoxy resin, and formed with a groove configured corresponding in position to the coupling area to receive an overflow of the heat-resistant epoxy resin.

To achieve the above and other effects, the present invention further provides a leak-proof LED base structure, comprising: a ceramic substrate having a first surface and a second surface, the first surface being provided with at least a pair of first electrodes thereon, formed with a die-mounting metal layer thereon, and defined with a coupling area, and the second surface being provided with a pair of second electrodes electrically connected to the first electrodes, respectively; and a ceramic reflection ring having a coupling surface and a polished reflecting surface, wherein the coupling surface is adjacent to the polished reflecting surface, coupled to the coupling area by a heat-resistant epoxy resin, and formed with a groove configured corresponding in position to the coupling area to receive an overflow of the heat-resistant epoxy resin.

To achieve the above and other effects, the present invention further provides a leak-proof LED base structure, comprising: a ceramic substrate having a first surface and a second surface, the first surface being provided with at least a pair of first electrodes thereon, formed with a die-mounting metal layer thereon, and defined with a coupling area, and the second surface being provided with a pair of second electrodes electrically connected to the first electrodes, respectively; and a ceramic reflection ring having a coupling surface, a reflecting surface, and a lens positioning portion formed at a top of the reflecting surface, wherein the coupling surface is adjacent to the reflecting surface, coupled to the coupling area by a heat-resistant epoxy resin, and formed with a groove configured corresponding in position to the coupling area to receive an overflow of the heat-resistant epoxy resin.

The present invention can be implemented to achieve at least the following effects each involving an inventive step:

1. The use of a heat-resistant epoxy resin enables an LED base to sustain temperature as high as 400° C. during its manufacturing process.

2. With the heat-resistant epoxy resin, a ceramic substrate and a ceramic reflection ring are firmly coupled to each other so as to prevent light emitted by an LED die from leaking through the junction of the ceramic substrate and the ceramic reflection ring, thereby preventing light leakage.

3. A groove for receiving an overflow of the heat-resistant epoxy resin is formed on a coupling surface of the ceramic reflection ring, so as to prevent the heat-resistant epoxy resin from flowing out of the ceramic reflection ring.

4. Forming a polished reflecting surface increases luminosity of light emitted by the LED.

5. The ceramic reflection ring is equipped with a lens positioning portion so as to allow a lens to be aligned with the ceramic reflection ring easily and yet enhance preciseness in positioning the lens.

BRIEF DESCRIPTION OF THE DRAWINGS

The features and advantages of present invention are described in detail hereunder to enable persons skilled in the art to understand and implement the disclosure of the present invention and readily apprehend objectives and advantages of the present invention with references made to the disclosure contained in the specification, the claims, and accompanying drawings, wherein:

DETAILED DESCRIPTION OF THE PREFERRED EMBODIMENT

Figure 1:
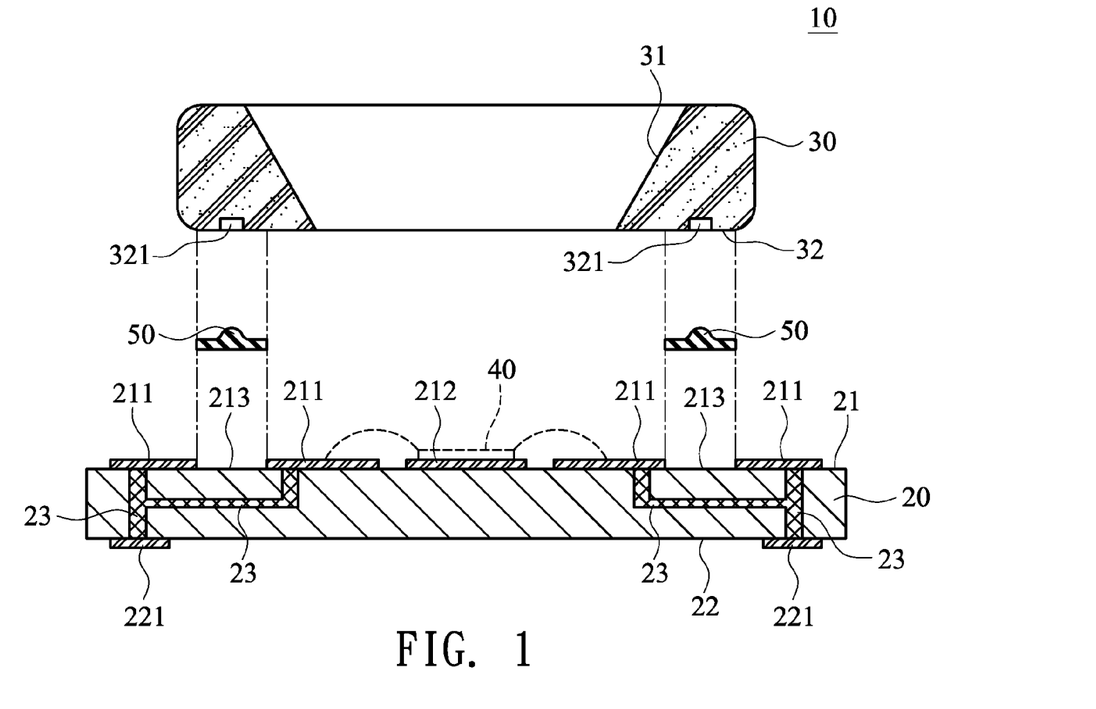
FIG. 1 is an exploded cross-sectional view of a first preferred embodiment of a leak-proof LED base structure of the present invention.
Figure 2:
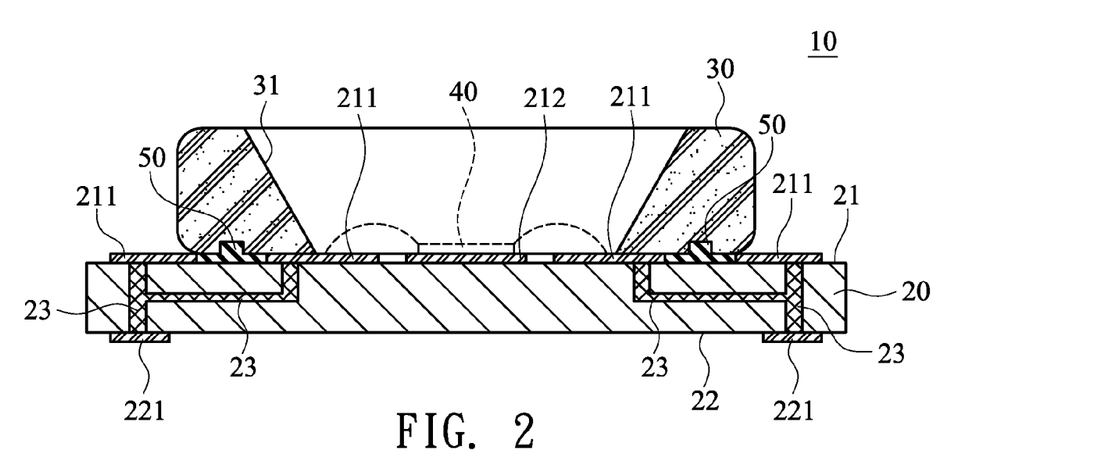
FIG. 2 is an assembled cross-sectional view of the first preferred embodiment shown in FIG. 1.

Referring to FIG. 1 and FIG. 2, in a first preferred embodiment, a leak-proof LED base structure 10 comprises a ceramic substrate 20 and a ceramic reflection ring 30.

The ceramic substrate 20 is an aluminum oxide substrate, an aluminum nitride substrate, or a low-temperature co-sintered ceramic (LTCC) substrate. The ceramic substrate 20 has remarkable heat transfer characteristics, and thus heat generated by an LED die 40 can be timely removed therefrom by the ceramic substrate 20 so as to enhance the efficiency of light emission by the LED die 40.

Figure 3:
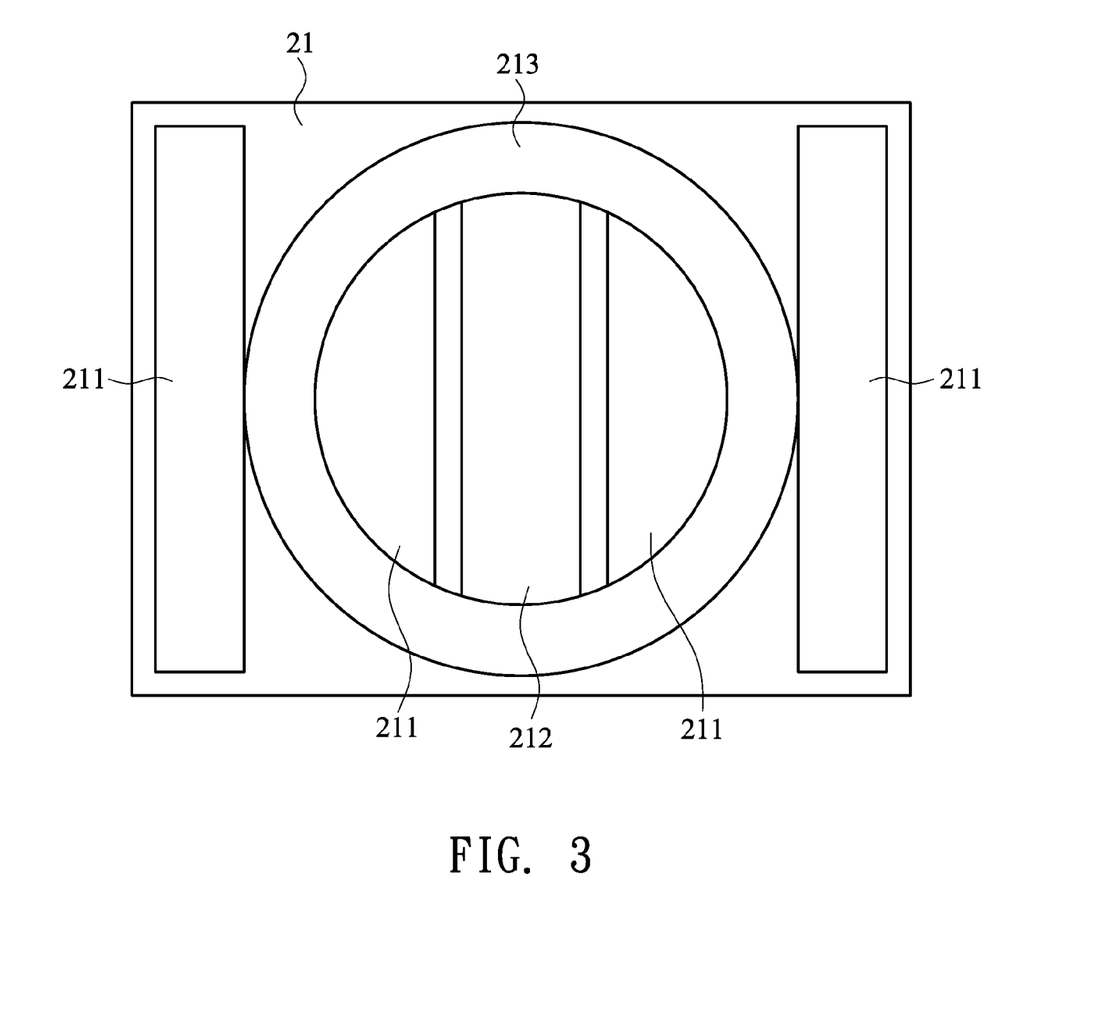
FIG. 3 is a top plan view of a ceramic substrate of the present invention.

Referring to FIG. 1, the ceramic substrate 20 has a first surface 21 and a second surface 22. Referring to FIG. 3, the first surface 21 of the ceramic substrate 20 is provided with at least a pair of first electrodes 211 thereon, formed with a die-mounting metal layer 212 thereon, and defined with a coupling area 213. The first electrodes 211 are electrically connected to an external circuit at a testing stage to determine whether the LED die 40 emits light normally. Referring to FIG. 2, the LED die 40 is mounted on the die-mounting metal layer 212, and the coupling area 213 is the area whereby the ceramic substrate 20 is coupled to the ceramic reflection ring 30.

For example, the first surface 21 of the ceramic substrate 20 are provided with two pairs of first electrodes 211. The paired first electrodes 211 flank the coupling area 213 and are electrically connected to each other by an electrically conductive layer 23 formed in the ceramic substrate 20. The LED die 40 mounted on the die-mounting metal layer 212 is electrically connected to the first electrodes 211 by wire bonding.

Figure 4:
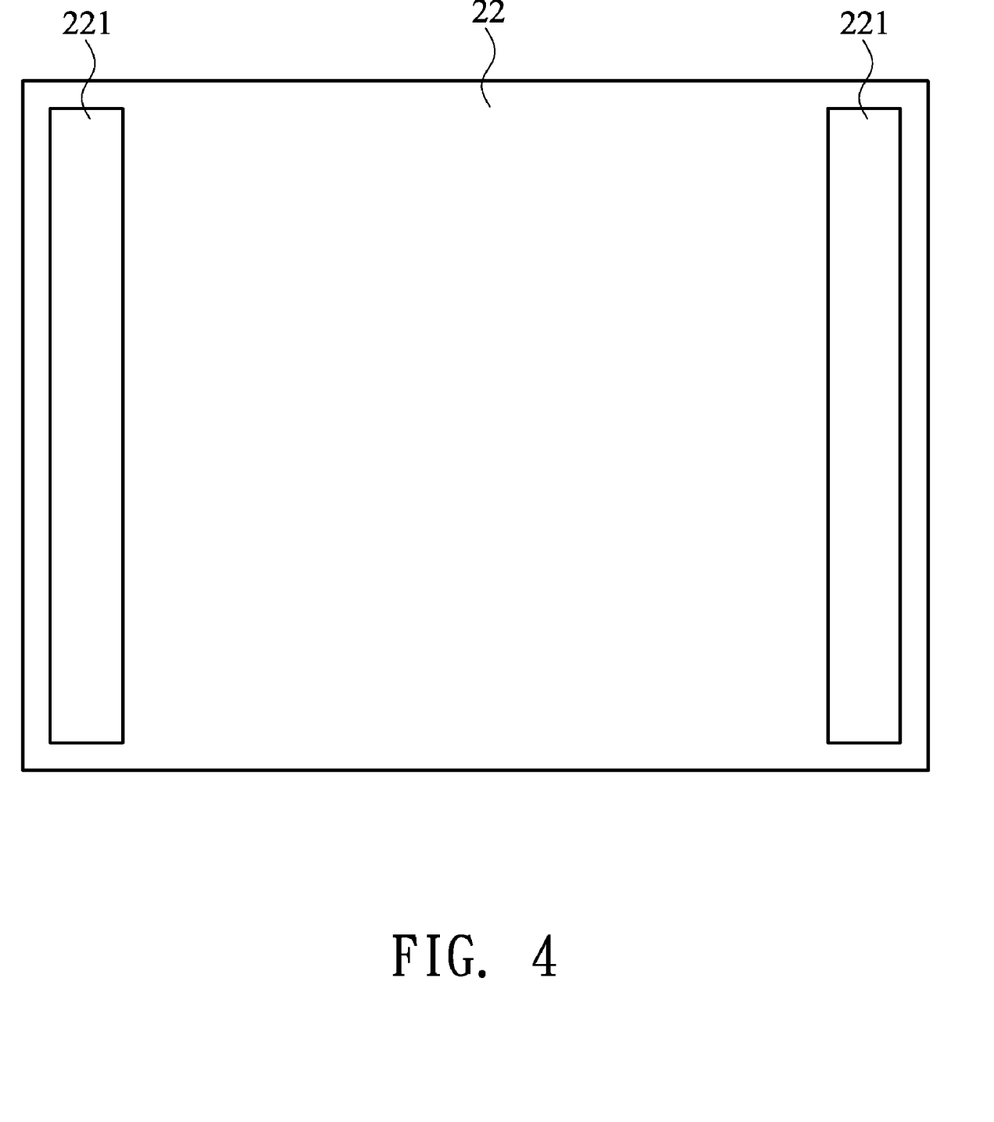
FIG. 4 is a bottom plan view of a first preferred embodiment of the ceramic substrate of the present invention.

Referring to FIG. 4, a pair of second electrodes 221 are disposed on the second surface 22 of the ceramic substrate 20, and the second electrodes 221 are directly electrically connected to a circuit board to enable the LED base structure 10 to become a surface mount device (SMD) for use with electronic components. Referring to FIG. 1 and FIG. 2, the second electrodes 221 are electrically connected to the first electrodes 211 by the electrically conductive layer 23 formed in the ceramic substrate 20, respectively.

Referring to FIG. 1, the ceramic reflection ring 30 has a reflecting surface 31 and a coupling surface 32. The coupling surface 32 of the ceramic reflection ring 30 is coupled to the coupling area 213 of the ceramic substrate 20. The reflecting surface 31 is adjacent to the coupling surface 32. The reflecting surface 31 of the ceramic reflection ring 30 is a taper reflecting surface or an arc-shaped reflecting surface. In a preferred embodiment, to increase luminosity of light emitted by the LED die 40, a polishing treatment is performed on the reflecting surface 31 to turn the reflecting surface 31 into a polished reflecting surface. The polishing treatment augments flatness and smoothness of the reflecting surface 31 and thereby increases reflectivity of the reflecting surface 31, and in consequence light emitted by the LED die 40 is reflected off the reflecting surface 31 efficiently before leaving the LED base structure 10.

The coupling surface 32 of the ceramic reflection ring 30 is coupled to the coupling area 213 of the ceramic substrate 20 by a heat-resistant epoxy resin 50 so as to firmly couple the ceramic reflection ring 30 and the ceramic substrate 20 together. The heat-resistant epoxy resin 50 is resistant to temperature of 270° C. or higher. Alternatively, the heat-resistant epoxy resin 50 is resistant to temperature of 300° C. or higher. Preferably, the heat-resistant epoxy resin 50 is resistant to temperature of 400° C. or higher. Hence, in a reflow process, the heat-resistant epoxy resin 50 is resistant to temperature as high as 260° C. typical of the reflow process. Meantime, the firm combination between the ceramic reflection ring 30 and the ceramic substrate 20 is ensured. As a result, the satisfactory outcome of various LED-specific tests, such as reliability test, aging test, and red ink test can be accomplished.

Please refer to FIG. 1 and FIG. 2. A groove 321 is formed on the coupling surface 32 of the ceramic reflection ring 30 to correspond in position to the coupling area 213 of the ceramic substrate 20. The groove 321 serves to receive the overflow of the heat-resistant epoxy resin 50. Thereby, the heat-resistant epoxy resin 50 is prevented from overflowing and the light of the LED die 40 is prevented from leaking through where the heat-resistant epoxy resin 50 may otherwise overflow.

The heat-resistant epoxy resin 50 has two merits: coupling the ceramic reflection ring 30 and the ceramic substrate 20 firmly together such that encapsulant filled in the LED base structure 10 is unlikely to overflow through the junction of the ceramic reflection ring 30 and the ceramic substrate 20; and being resistant to the high temperature required for a reflow process. The groove 321 formed on the coupling surface 32 of the ceramic reflection ring 30 has two merits: preventing the heat-resistant epoxy resin 50 from flowing out of the ceramic reflection ring 30; and preventing light emitted from the LED die 40 from leaking through the junction of the ceramic substrate 20 and the ceramic reflection ring 30.

Figure 5:
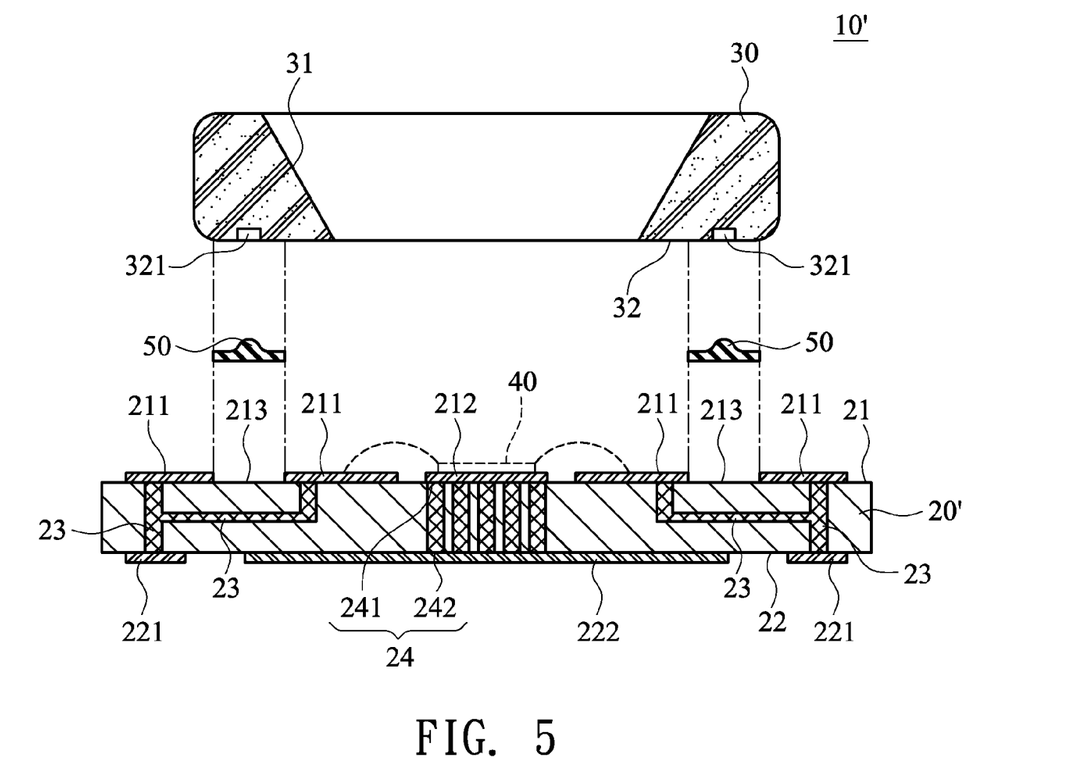
FIG. 5 is an exploded cross-sectional view of a second preferred embodiment of the leak-proof LED base structure of the present invention.
Figure 6:
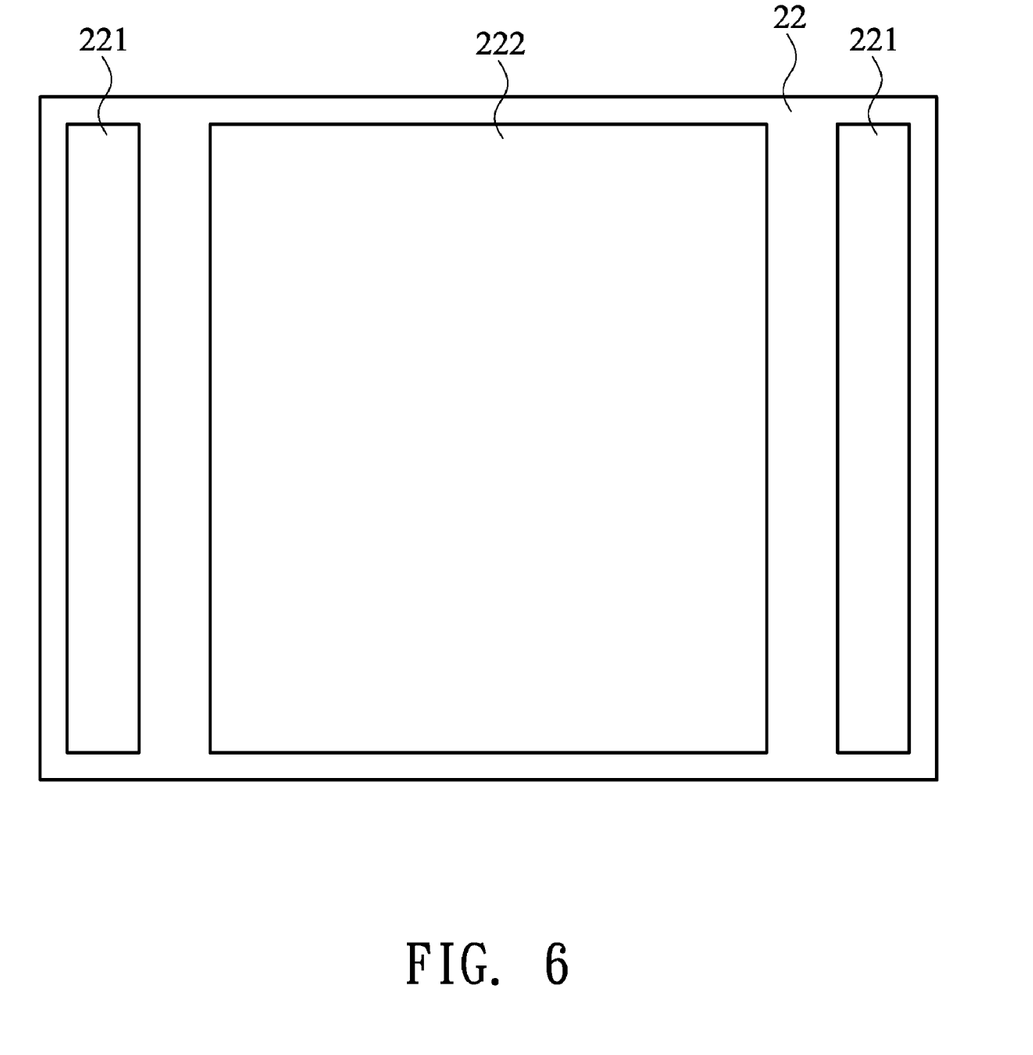
FIG. 6 is a bottom plan view of a second preferred embodiment of the ceramic substrate of the present invention.

Referring to FIG. 5, to render an LED base structure 10' effective in heat transfer, at least a thermally conductive post 24 is provided in a ceramic substrate 20'. The thermally conductive post 24 has a first end portion 241 coupled to the die-mounting metal layer 212 on the first surface 21 in a thermally conductive manner to enhance heat transfer. Heat generated by the LED die 40 is directly removed therefrom by the die-mounting metal layer 212 and the thermally conductive post 24. Please refer to FIG. 5 and FIG. 6. The second surface 22 of the ceramic substrate 20' is further formed with a thermally conductive metal layer 222 thereon. The thermally conductive metal layer 222 is coupled to a second end portion 242 of the thermally conductive post 24 in a thermally conductive manner. Thereby, heat transferred from the thermally conductive post 24 to the thermally conductive metal layer 222 can be quickly spread and transferred to other positions.

Figure 7:
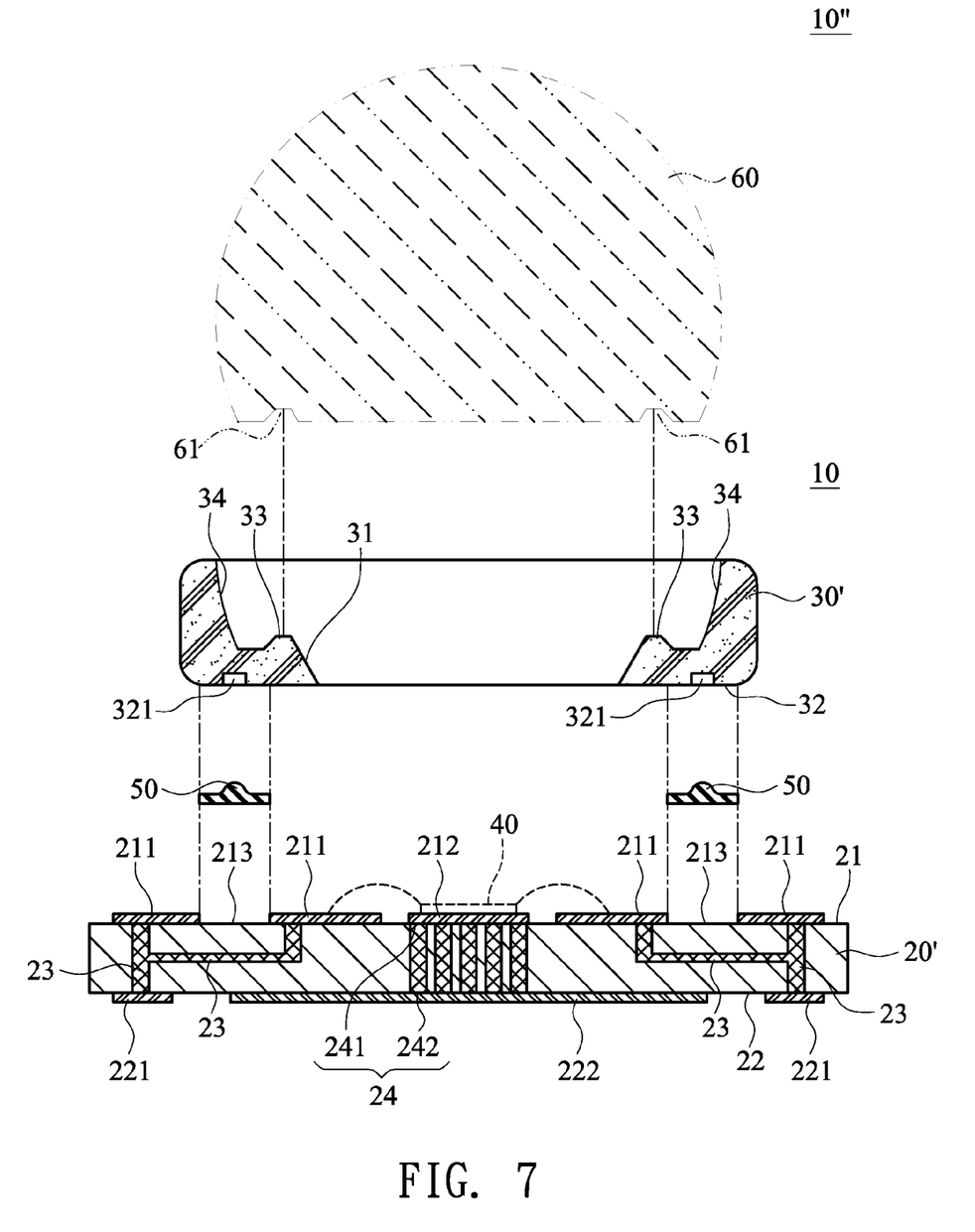
FIG. 7 is an exploded cross-sectional view of a third preferred embodiment of the leak-proof LED base structure of the present invention.
Figure 8:
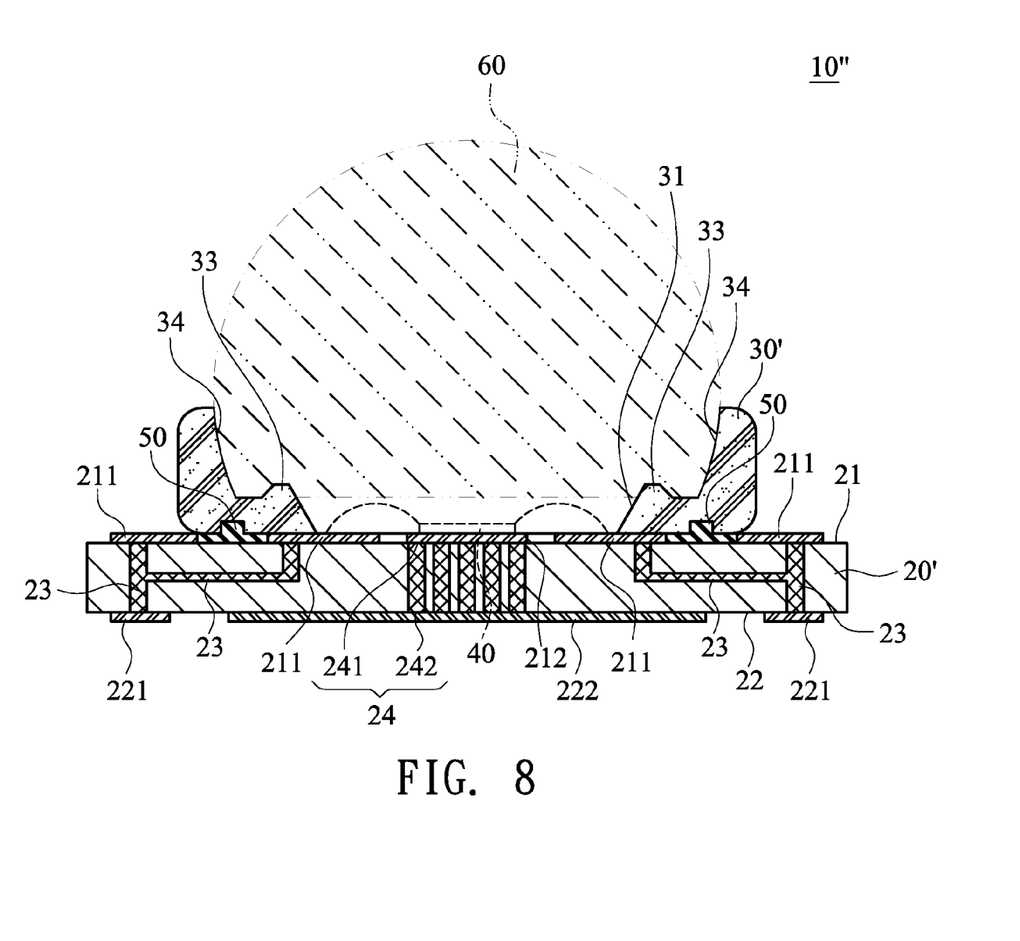
FIG. 8 is an assembled cross-sectional view of the third preferred embodiment shown in FIG. 7.

Referring to FIG. 7 and FIG. 8, to allow a lens 60 to be precisely aligned with a ceramic reflection ring 30' and provided thereon when encapsulating the lens 60, a lens positioning portion 33 is formed on the top of the reflecting surface 31 of the ceramic reflection ring 30'. The lens positioning portion 33 matches a trench 61 of the lens 60 such that the trench 61 of the lens 60 engages the lens positioning portion 33. The lens positioning portion 33 is a positioning flange that serves two purposes: allowing the lens 60 to be precisely aligned with the ceramic reflection ring 30' and positioned thereon; and allowing the optical axis of the lens 60 to be precisely aligned with the optical axis of light emission of the LED die 40 so as to achieve an optical effect devised in advance.

In addition, to allow the lens 60 to be efficiently mounted on the ceramic reflection ring 30', the area of contact between the ceramic reflection ring 30' and the lens 60 is an arc-shaped contact surface 34 in conformity with the profile of the lens 60. Hence, the lens 60 can be mounted on and dismounted from the ceramic reflection ring 30' easily, and an assembly process of the lens 60 is smooth.

The foregoing preferred embodiments are only illustrative of the features of the present invention but are not intended to restrict the scope of the present invention. The foregoing preferred embodiments allow persons skilled in the art to gain insight into the present invention and therefore be able to implement the present invention. It is apparent to those skilled in the art that all equivalent modifications and variations made in the foregoing preferred embodiments according to the spirit and principle in the disclosure of the present invention should fall within the scope of the appended claims.

What is claimed is:

1. A leak-proof LED base structure, comprising:
a ceramic substrate having a first surface and a second surface, the first surface being provided with at least a pair of first electrodes thereon, formed with a die-mounting metal layer thereon, and defined with a coupling area, and the second surface being provided with a pair of second electrodes electrically connected to the first electrodes, respectively; and
a ceramic reflection ring having a coupling surface, a polished reflecting surface, and a lens positioning portion formed at a top of the polished reflecting surface, wherein the coupling surface is adjacent to the polished reflecting surface, coupled to the coupling area by a heat-resistant epoxy resin, and formed with a groove configured corresponding in position to the coupling area to receive an overflow of the heat-resistant epoxy resin.

2. The LED base structure of claim 1, wherein the ceramic substrate is an aluminum oxide substrate, an aluminum nitride substrate, or a low-temperature co-sintered ceramic (LTCC) substrate.

3. The LED base structure of claim 1, wherein the ceramic substrate has at least a thermally conductive post provided therein, the thermally conductive post having a first end portion coupled to the die-mounting metal layer in a thermally conductive manner to enhance heat transfer.

4. The LED base structure of claim 3, wherein the second surface is further formed with a thermally conductive metal layer coupled to a second end portion of the thermally conductive post in a thermally conductive manner to enhance heat transfer.

5. The LED base structure of claim 1, wherein the heat-resistant epoxy resin is resistant to temperature of 270° C. or higher, temperature of 300° C. or higher, or temperature of 400° C. or higher.

6. The LED base structure of claim 1, wherein the lens positioning portion is a positioning flange.

7. A leak-proof LED base structure, comprising:
a ceramic substrate having a first surface and a second surface, the first surface being provided with at least a pair of first electrodes thereon, formed with a die-mounting metal layer thereon, and defined with a coupling area, and the second surface being provided with a pair of second electrodes electrically connected to the first electrodes, respectively; and
a ceramic reflection ring having a coupling surface and a polished reflecting surface, wherein the coupling surface is adjacent to the polished reflecting surface, coupled to the coupling area by a heat-resistant epoxy resin, and formed with a groove configured corresponding in position to the coupling area to receive an overflow of the heat-resistant epoxy resin.

8. The LED base structure of claim 7, wherein the ceramic substrate is an aluminum oxide substrate, an aluminum nitride substrate, or a low-temperature co-sintered ceramic (LTCC) substrate.

9. The LED base structure of claim 7, wherein the ceramic substrate has at least a thermally conductive post provided therein, the thermally conductive post having a first end portion coupled to the die-mounting metal layer in a thermally conductive manner to enhance heat transfer.

10. The LED base structure of claim 9, wherein the second surface is further formed with a thermally conductive metal layer coupled to a second end portion of the thermally conductive post in a thermally conductive manner to enhance heat transfer.

11. The LED base structure of claim 7, wherein the heat-resistant epoxy resin is resistant to temperature of 270° C. or higher, temperature of 300° C. or higher, or temperature of 400° C. or higher.

12. The LED base structure of claim 7, wherein a lens positioning portion is formed at a top of the polished reflecting surface.

13. The LED base structure of claim 12, wherein the lens positioning portion is a positioning flange.

14. A leak-proof LED base structure, comprising:
a ceramic substrate having a first surface and a second surface, the first surface being provided with at least a pair of first electrodes thereon, formed with a die-mounting metal layer thereon, and defined with a coupling area, and the second surface being provided with a pair of second electrodes electrically connected to the first electrodes, respectively; and a ceramic reflection ring having a coupling surface, a reflecting surface, and a lens positioning portion formed at a top of the reflecting surface, wherein the coupling surface is adjacent to the reflecting surface, coupled to the coupling area by a heat-resistant epoxy resin, and formed with a groove configured corresponding in position to the coupling area to receive an overflow of the heat-resistant epoxy resin.

15. The LED base structure of claim 14, wherein the ceramic substrate is an aluminum oxide substrate, an aluminum nitride substrate, or a low-temperature co-sintered ceramic (LTCC) substrate.

16. The LED base structure of claim 14, wherein the ceramic substrate has at least a thermally conductive post provided therein, the thermally conductive post having a first end portion coupled to the die-mounting metal layer in a thermally conductive manner to enhance heat transfer.

17. The LED base structure of claim 16, wherein the second surface is further formed with a thermally conductive metal layer coupled to a second end portion of the thermally conductive post in a thermally conductive manner to enhance heat transfer.

18. The LED base structure of claim 14, wherein the heat-resistant epoxy resin is resistant to temperature of 270° C. or higher, temperature of 300° C. or higher, or temperature of 400° C. or higher.

19. The LED base structure of claim 14, wherein the reflecting surface is a polished reflecting surface.

20. The LED base structure of claim 14, wherein the lens positioning portion is a positioning flange.

* * * * *